(12) United States Patent
Nakano

(10) Patent No.: US 8,492,896 B2
(45) Date of Patent: Jul. 23, 2013

(54) SEMICONDUCTOR APPARATUS AND SEMICONDUCTOR APPARATUS UNIT

(75) Inventor: Sumiaki Nakano, Nara (JP)

(73) Assignee: Panasonic Corporation, Osaka (JP)

( * ) Notice: Subject to any disclaimer, the term of this patent is extended or adjusted under 35 U.S.C. 154(b) by 162 days.

(21) Appl. No.: 13/034,930

(22) Filed: Feb. 25, 2011

(65) Prior Publication Data

US 2011/0285008 A1 Nov. 24, 2011

(30) Foreign Application Priority Data

May 21, 2010 (JP) ................................. 2010-116946

(51) Int. Cl.
*H01L 23/488* (2006.01)

(52) U.S. Cl.
USPC ................... 257/738; 257/737; 257/E23.141; 438/613

(58) Field of Classification Search
USPC ........... 257/692, 737, 738, E23.141; 438/613
See application file for complete search history.

(56) References Cited

U.S. PATENT DOCUMENTS

| | | | |
|---|---|---|---|
| 4,426,252 A | 1/1984 | Kape | |
| 4,786,936 A | 11/1988 | Ikegawa et al. | |
| 5,498,837 A | 3/1996 | Yamashita | |
| 5,952,102 A | 9/1999 | Cutler | |
| 6,940,160 B1 | 9/2005 | Hanaoka et al. | |
| 7,030,496 B2 * | 4/2006 | Shinyama et al. | 257/773 |
| 7,855,442 B2 * | 12/2010 | Magerlein et al. | 257/686 |
| 2002/0028410 A1 | 3/2002 | Choi | |
| 2003/0110632 A1 | 6/2003 | Iwase | |
| 2005/0258522 A1 | 11/2005 | En et al. | |
| 2006/0249844 A1 * | 11/2006 | Yang | 257/737 |
| 2007/0082475 A1 * | 4/2007 | Park | 438/612 |
| 2007/0200239 A1 * | 8/2007 | Su | 257/738 |
| 2007/0273031 A1 * | 11/2007 | Lee et al. | 257/759 |

(Continued)

FOREIGN PATENT DOCUMENTS

| | | |
|---|---|---|
| JP | 1-312084 | 12/1989 |
| JP | 09-129647 A | 5/1997 |

(Continued)

OTHER PUBLICATIONS

United States Office Action issued in U.S. Appl. No. 13/098,895 mailed on Jan. 18, 2013.

(Continued)

*Primary Examiner* — Allan R Wilson

(74) *Attorney, Agent, or Firm* — McDermott Will & Emery LLP

(57) ABSTRACT

A semiconductor apparatus including: a substrate 12; a plurality of electrode pads 20 formed on a surface of the substrate 12; and a protection film 14 having a plurality of through holes 16 formed in one-to-one correspondence with the electrode pads 20, and covering circumferential edge portions of the electrode pads 20 and the surface of the substrate 12 except for areas under the electrode pads 20. An inner wall of each through hole 16 is a slant surface 22 slanted toward outside of the through hole 16. A plurality of metal layers 24 have been formed, each covering an exposed part of each electrode pad 20 not covered by the protection film 14 and an area of each slant surface extending from the exposed part up to a middle of the slant surface. A plurality of bumps 18 have been connected one-to-one with the metal layers 24.

20 Claims, 12 Drawing Sheets

U.S. PATENT DOCUMENTS

| | | |
|---|---|---|
| 2008/0174014 A1 | 7/2008 | Hanaoka |
| 2008/0185721 A1 | 8/2008 | Oomori et al. |
| 2009/0057892 A1 | 3/2009 | Osumi |
| 2009/0196011 A1 | 8/2009 | Kobayashi et al. |
| 2009/0206479 A1 | 8/2009 | Daubenspeck et al. |
| 2011/0186987 A1* | 8/2011 | Wang et al. .................... 257/737 |
| 2012/0139107 A1* | 6/2012 | Nakano .......................... 257/737 |

FOREIGN PATENT DOCUMENTS

| | | |
|---|---|---|
| JP | 2001-237261 | 8/2001 |
| JP | 2002-353370 A | 12/2002 |
| JP | 2004-071943 A | 3/2004 |
| JP | 2004-228200 | 8/2004 |
| JP | 2005-044865 A | 2/2005 |
| JP | 2006-012952 | 1/2006 |
| JP | 2006-019550 A | 1/2006 |
| JP | 2008-192859 | 8/2008 |
| JP | 2009-064812 A | 3/2009 |
| JP | 4360293 | 11/2009 |

OTHER PUBLICATIONS

Colwell, "Chapter 3: Metallographic Analysis", Corrosion Tests and Standards: Application and Interpretation, ASTM International, 2nd Ed, (2005), pp. 66-75.

* cited by examiner

Step G

Step H

SEMICONDUCTOR APPARATUS AND SEMICONDUCTOR APPARATUS UNIT

The disclosure of Japanese Patent Application No. 2010-116946 filed May 21, 2010 including specification, drawings and claims is incorporated herein by reference in its entirety.

TECHNICAL FIELD

The present invention relates to a semiconductor apparatus and a semiconductor apparatus unit, and to a semiconductor apparatus or the like such as a small semiconductor package or the like typified by CSP (Chip Size Package, or Chip Scale Package) having, for example, bumps as the terminals.

BACKGROUND ART

The CSP has a structure in which a plurality of electrode pads are formed on one surface of a silicon (Si) substrate in which a plurality of semiconductor devices such as transistors (not illustrated) are provided, and each of the plurality of electrode pads is connected with a different bump as an external terminal (see, for example, Patent Literature 1).

FIG. 12A is a partial cross-sectional view of the CSP at one bump.

As shown in FIG. 12A, on one surface of a Si substrate 200, an electrode pad 202 is formed. Also, a protection film 204 made of silicone nitride ($Si_3N_4$) is formed to cover a circumferential edge portion of the electrode pad 202 and the surface of the substrate except for the area under the electrode pad 202. A metal layer 206 made of Under Barrier Metal (UBM) is formed to cover an exposed portion of the surface of the electrode pad 202 and a portion of the protection film 204 surrounding an opening on the exposed portion. The metal layer 206 is connected with a bump 208.

The connection of the bump 208 with the metal layer 206 is performed, for example, as follows.

That is to say, the bump is connected with the metal layer by first applying flux to the surface of the metal layer, then putting, as a bump material, a solder ball made of, for example, a Sn—Ag-based lead-free solder material onto the flux-applied surface, and melting part of the solder ball by the reflow.

CITATION LIST

Patent Literature

Patent Literature 1
Japanese Patent Application Publication No. 2004-228200
Patent Literature 2
Japanese Patent Application Publication No. 2006-12952
Patent Literature 3
Japanese Patent Application Publication No. 2008-192859

SUMMARY OF INVENTION

Technical Problem

A normal bump has a shape rising upward from the circumferential edge of the metal layer 206 as shown in FIG. 12A, while one example of defective bump has a shape sticking out of the metal layer 206, expanding horizontally (in the direction along the surface of the substrate) as shown in FIG. 12B.

The presence of such a defective bump causes a failure that adjacent bumps contact with each other when the CSP is mounted on another mounting substrate or the like. The above problem is prominent especially under the present set of circumstances where the downsizing of the CSP is promoted in line with the recent trend where mobile electronic machines such as mobile phones or digital video cameras into which the CSP is embedded are becoming smaller and smaller in size, and thus the bumps are need to be arranged with smaller pitch therebetween.

One may consider that, by reducing the size of each bump (bump material), the bump could be prevented from running over the edge of the metal layer. However, if such a CSP having smaller bumps were manufactured and mounted on (connected, via the smaller bumps, with) another mounting substrate, a sufficient connection force or a sufficient electric conductivity might not be obtained.

It should be noted here that the above-described problem is not limited to the CSP, but may occur in semiconductor apparatuses in general having such a structure where a plurality of bumps are provided on one surface of a substrate, like the BGA (Ball Grid Array).

It is therefore an object of the present invention to provide a semiconductor apparatus having a structure that can prevent the bump from sticking out largely of the metal layer as much as possible. It is also an object of the present invention to provide a semiconductor apparatus unit having the semiconductor apparatus.

Solution to Problem

The above object is fulfilled by a semiconductor apparatus comprising: a substrate; a plurality of electrode pads formed on a surface of the substrate; and a protection film having a plurality of through holes formed in one-to-one correspondence with the electrode pads, and covering circumferential edge portions of the electrode pads and the surface of the substrate except for areas under the electrode pads, wherein an inner wall of each through hole is a slant surface slanted such that the through hole expands with distance from an electrode pad corresponding thereto, a plurality of metal layers have been formed in one-to-one correspondence with the electrode pads, each of the metal layers covering (i) an exposed part of a corresponding electrode pad not covered by the protection film and (ii) an area of a corresponding slant surface extending from the exposed part up to a middle of the slant surface, and a plurality of bumps have been connected one-to-one with the plurality of metal layers.

In the above semiconductor apparatus, a slant angle of each slant surface to the electrode pad may increase with distance from the electrode pad.

In the above semiconductor apparatus, the protection film may have a two-layer structure composed of a first layer and a second layer stacked on the substrate in this order, and a slant angle of a slant surface in the second layer to the electrode pad is larger than a slant angle of a slant surface in the first layer to the electrode pad.

In the above semiconductor apparatus, a diameter of a through hole in the second layer may be larger than a diameter of a through hole in the first layer, and the slant surface in each through hole has been formed in a staircase pattern.

In the above semiconductor apparatus, a circumferential end of the metal layer may be positioned at a middle of the first layer in a thickness direction.

In the above semiconductor apparatus, the circumferential end of the metal layer may be positioned at an upper surface of the first layer.

In the above semiconductor apparatus, the plurality of electrode pads may be arranged in a matrix.

In the above semiconductor apparatus, in the area of each slant surface extending from the exposed part up to the middle of the slant surface, a slant angle of the slant surface to the electrode pad may increase with distance from the electrode pad.

In the above semiconductor apparatus, in an area of each slant surface extending from the middle thereof to an upper surface of the protection film, the slant angle of the slant surface to the electrode pad may decrease with distance from the electrode pad.

The above object is also fulfilled by a semiconductor apparatus unit in which the above semiconductor apparatus is mounted on a mounting substrate.

Advantageous Effects of Invention

According to the semiconductor apparatus with the above structure, since the inner wall of each through hole is a slant surface of the protection film, and the metal layer, with which the bump is connected, has been formed to cover an area of each slant surface extending from the exposed part up to the middle of the slant surface. When, for example, the bump material is mounted on the metal layer and an attempt is made to connect the bump material with the metal layer by the reflow, the melted bump material will extend and nearly run over the edge of the metal layer. With the above structure, however, the extension of the melted bump material is stopped by the slant surface of the protection film. The structure thus produces an advantageous effect that it prevents, as much as possible, the bump from being formed in the shape sticking out from the edge of the metal layer.

BRIEF DESCRIPTION OF DRAWINGS

The present invention will be described with reference to the drawings, in which.

DESCRIPTION OF EMBODIMENTS

Figure 1A:
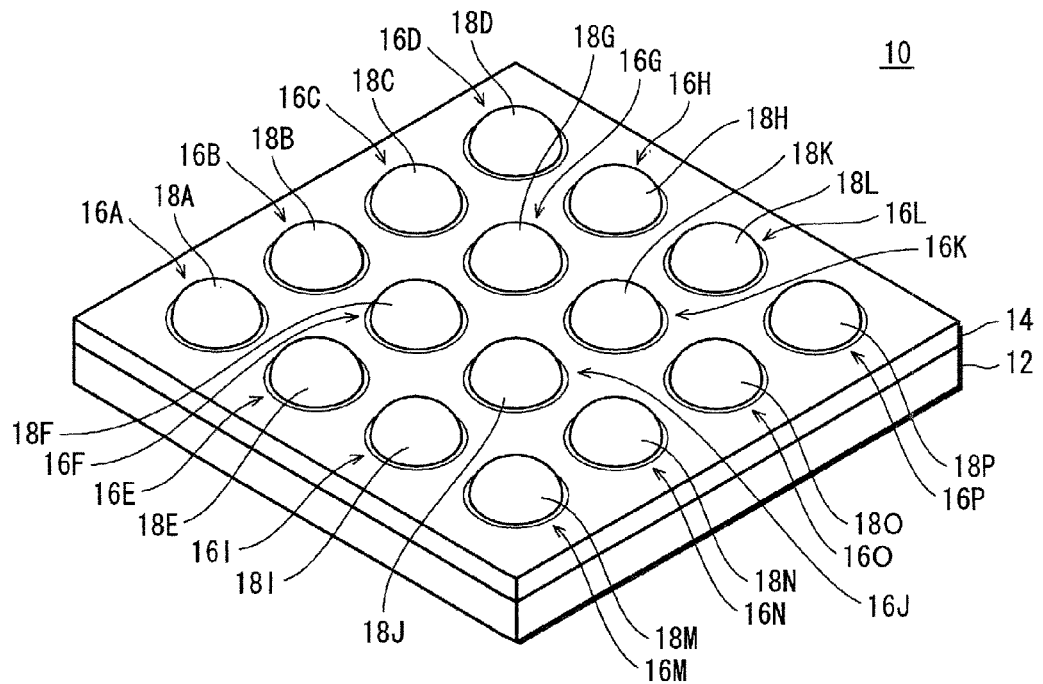
FIG. 1A is a perspective view of a semiconductor apparatus in Embodiment 1.

The following describes embodiments of a semiconductor apparatus of the present invention, with reference to the attached drawings. Note that not all of the structural components in the drawings are drawn to a unified scale.
<Embodiment>1

Figure 1B:
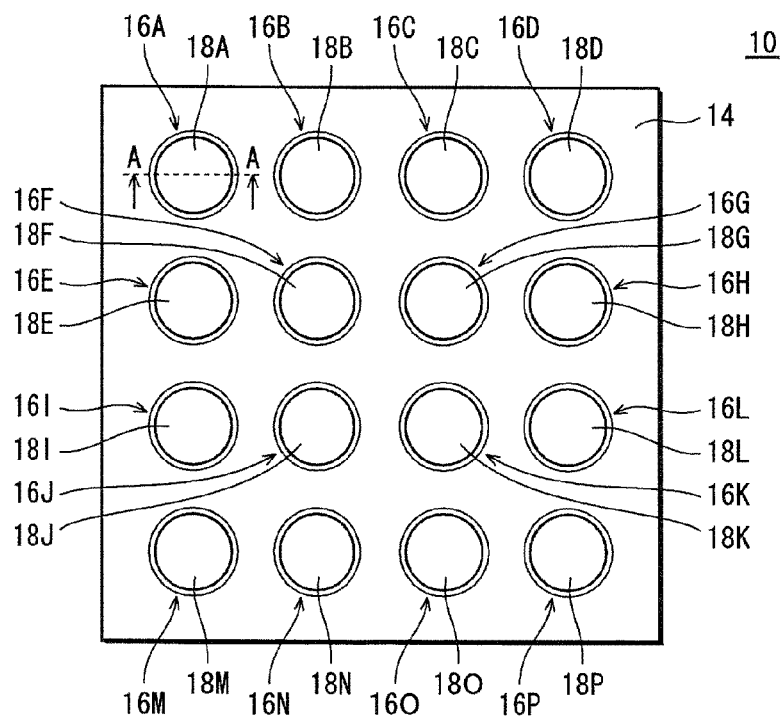
FIG. 1B is a plan view of the semiconductor apparatus.

FIG. 1A is a perspective view of a semiconductor apparatus 10 in Embodiment 1; and FIG. 1B is a plan view of the semiconductor apparatus 10. The semiconductor apparatus 10 is a semiconductor package of a CSP type.

The semiconductor apparatus 10 includes a silicon (Si) substrate 12 (hereinafter, merely referred to as "substrate 12") which is provided with a plurality of semiconductor devices (not illustrated) such as transistors. The substrate 12 is, for example, 8×8 [mm] in size.

On one main surface of the substrate 12, a protection film 14 is formed. The protection film 14 is made of, for example, silicone nitride ($Si_3N_4$). Through holes 16A-16P, which will be described later, have been opened in the protection film 14 in a matrix of 4 rows by 4 columns, and bumps 18A-18P have projected from the through holes 16A-16P, respectively. Accordingly, a plurality of (in this example, 16) bumps are arranged in a matrix (rows and columns). The pitch between the bumps 18A-18P is, for example, 160 [μm]. Note that since all the through holes 16A-16P have the same structure and all the bumps 18A-18P have the same structure, they may be represented only by the numeral with the alphabet omitted (for example, "through hole 16" or "bump 18") when there is no need to distinguish between them.

Figure 2:
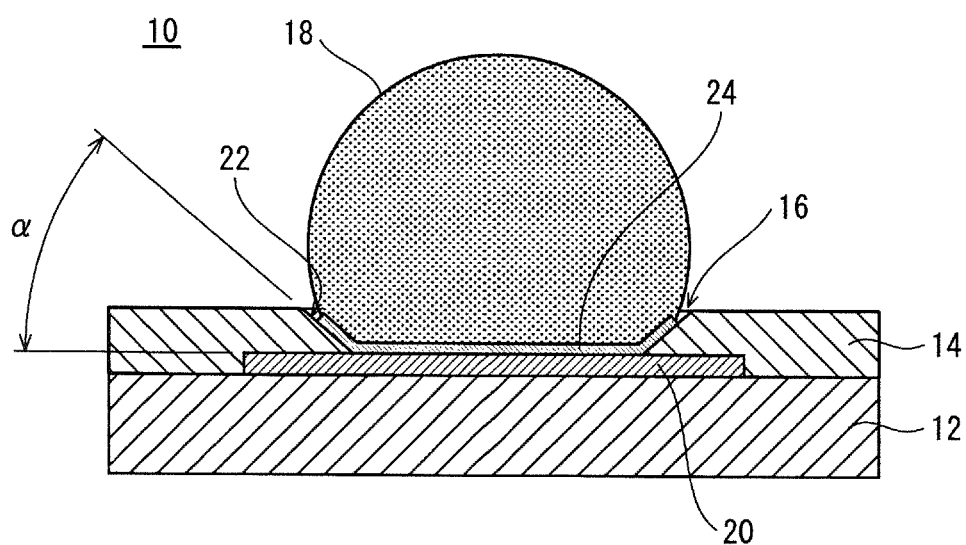
FIG. 2 is a cross-sectional view taken along the line A-A of FIG. 1B.

FIG. 2 is a cross-sectional view taken along the line A-A of FIG. 1B.

As shown in FIG. 2, an electrode pad 20 is formed on a main surface of the substrate 12 via an inter-layer insulation film (not illustrated). The electrode pad 20 is made of, for example, aluminum (Al). Note that the inter-layer insulation film (not illustrated) is formed over the whole main surface on one side of the substrate 12.

The protection film 14 has a through hole 16 having been opened in correspondence with the electrode pad 20. The protection film 14 is formed to cover the circumferential edge of the electrode pad 20 and the substrate 12. An inner wall 22 of the through hole 16 is formed to be a slant surface 22 which is slanted toward the outside of the through hole 16. The slant angle α of the slant surface 22 to the electrode pad 20 will be described later.

A metal layer 24, as an Under Barrier Metal (UBM) layer, is formed to cover an exposed part of the electrode pad 20 not covered by the protection film 14 and an area extending from the exposed part of the electrode pad 20 up to the middle of the slant surface 22. The metal layer 24 is made of, for example, nickel (Ni).

The metal layer 24 is connected with the bump 18. The bump 18 is made of, for example, a Sn—Ag-based lead-free solder material. Note that, not limited to the Sn—Ag-based lead-free solder material, the bump 18 may be made of a Sn—Cu-based material, a Sn—Cu—Ni-based material or the like.

Here, it is desirable that the two phases, namely the metal layer 24 and the bump 18 are formed to be in contact with each other on the slant surface 22 of the protection film 14. This is because, when they are formed in this manner, the variation of the shape of the bump is reduced. However, the formation of the metal layer 24 and the bump 18 is not limited to this manner.

Figure 3:
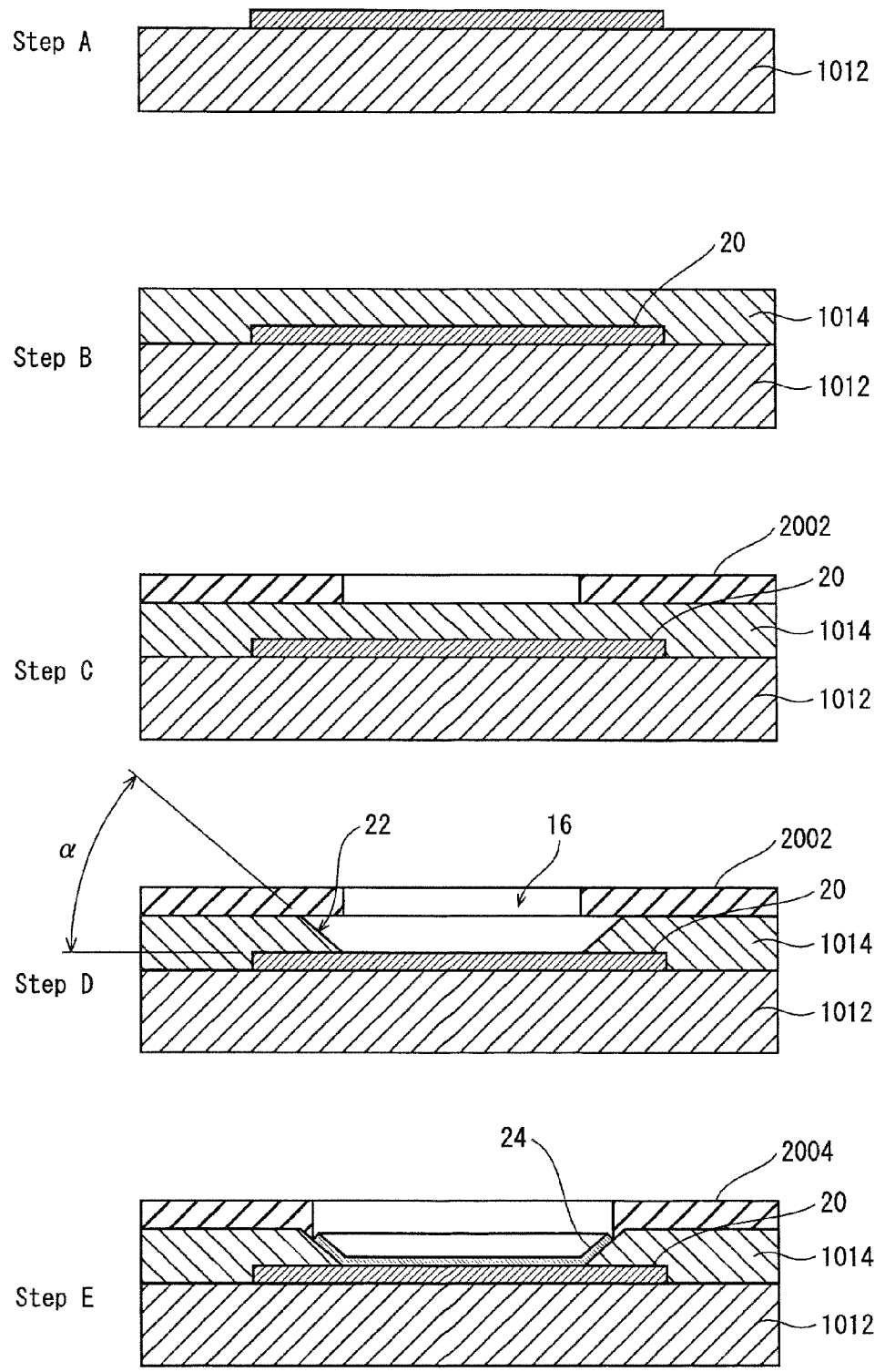
FIG. 3 illustrates some steps constituting a manufacturing process of the semiconductor apparatus in Embodiment 1.

A manufacturing method of the semiconductor apparatus 10 having the above structure will be described with reference to FIGS. 3 and 4.

On a surface on one side of a wafer 1012 before the singulation (step A), a silicone nitride film 1014 which is to be the protection film 14 (see FIG. 1) is formed. The silicone nitride film 1014 is planarized by the CMP (Chemical and Mechanical Polishing) (step B).

The silicone nitride film 1014 is covered with a masking member 2002 so that an area in which the through hole 16 is to be formed is exposed and the remaining area is covered by the masking member 2002 (step C).

The through hole 16 is then formed by removing a part of the silicone nitride film 1014 by the wet etching method using a chemical solution such as hot phosphoric acid $H_3PO_4$ (step D). Here, the etching progresses isotropically. Accordingly, by the side etching effect, the inner wall 22 of the through hole 16 is formed to be the slant surface 22 slanted toward the outside of the through hole 16. The size of the slant angle α of the slant surface 22 to the electrode pad 20 can be adjusted by, for example, applying in sequence a plurality of masking members that differ in opening diameter.

Following this, the masking member 2002 is removed, then a masking member 2004 is newly formed so that an area in which the metal layer 24 (see FIG. 2) is to be formed is exposed and the remaining area is covered thereby, and the metal layer 24 is formed by the sputtering or the vapor deposition (step E).

The masking member 2004 is removed, and then an adhesive flux 2006 is filled into the through hole 16 by printing, and a spherical bump material 1018 is mounted on the metal layer 24 (step G). The bump material is a Sn—Ag-based lead-free solder material. Also, the diameter of the bump material 1018 is in the range from 0.07 [mm] to 0.125 [mm]. Note that, not limited to the Sn—Ag-based lead-free solder material, the bump material 1018 may be made of a Sn—Cu-based material, a Sn—Cu—Ni-based material or the like.

The bump material 1018 is caused to be half-melting by the reflow, so that the lower part of the bump material 1018 is gradually planarized along the surface of the metal layer 24 by the own weight thereof. That is to say, originally the bump material 1018 is nearly in point contact with the metal layer 24, but then it changes to the plane contact, and the contact area extends gradually. Here, since the peripheral edge of the metal layer 24 has been formed on the slant surface 22 of the protection film 14, the extension of the contact area is stopped by the (slanted) peripheral edge. In this way, the structure prevents the bump 18 from being formed in the shape sticking out from the edge of the metal layer 24 as much as possible. Also, even if the bump material 1018 extends, running over the edge of the metal layer 24, the extension of the bump material 1018 is eventually stopped by the slant area (the slant surface 22) of the protection film 14 succeeding the metal layer 24. As a result, the bump material 1018 does not run over the slant surface 22 of the protection film 14 when it extends, and its contact area remains in the through hole 16.

Figure 12A:
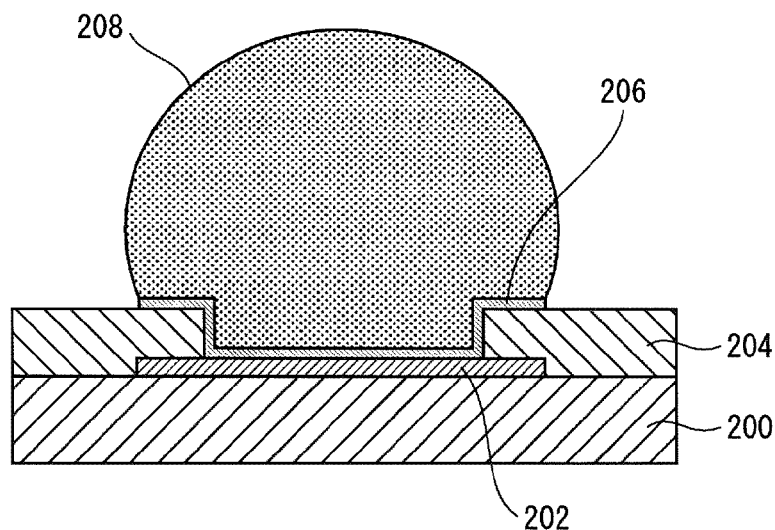
FIG. 12A shows an example of a normal bump in a conventional semiconductor apparatus.
Figure 12B:
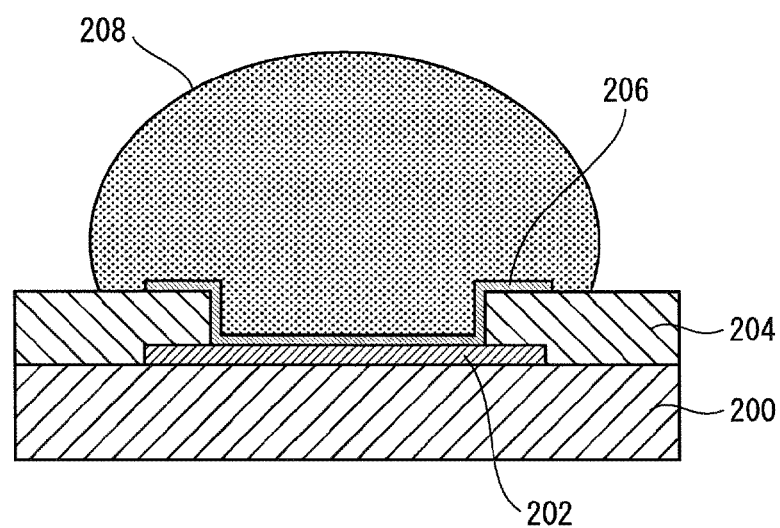
FIG. 12B shows an example of a defective bump in the conventional semiconductor apparatus.

Accordingly, compared to a conventional structure where the circumferential edge of the metal layer 206 is flat (horizontal) and the protection film 204, which succeeds the circumferential edge of the metal layer 206, is also flat (horizontal) (see FIGS. 12A and 12B), namely a structure which is not provided with any means for preventing the bump material from extending out, the structure of the present embodiment can prevent the bump from being planarized excessively. This prevents as much as possible the failure that adjacent bumps contact with each other when the semiconductor apparatus 10 is mounted on another mounting substrate or the like.

The slant angle α of the slant surface 22 to the electrode pad 20 may be smaller than 90 degrees, and preferably in the range from 15 degrees to 75 degrees. Further preferably, the slant angle α is in the range from 30 degrees to 60 degrees.

<Embodiment>2

Figure 5A:
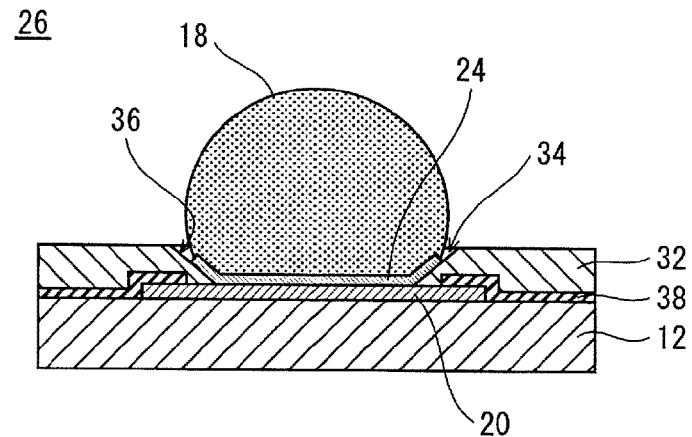
FIGS. 5A-5C are partial cross-sectional views of semiconductor apparatuses as the first through third examples of Embodiment 2 taken along a line passing through a bump.
Figure 5B:
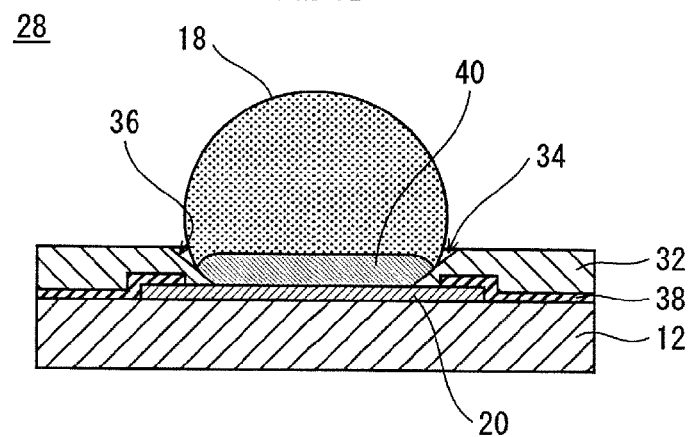
Figure 5C:
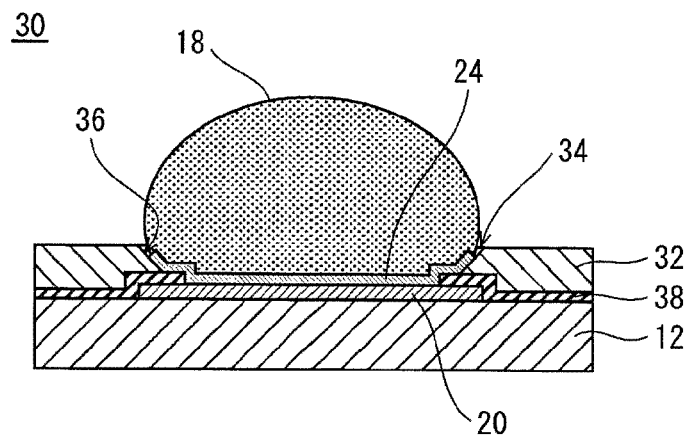

FIGS. 5A-5C are partial cross-sectional views of the semiconductor apparatus of Embodiment 2 taken along a line passing through a bump. FIG. 5A shows a semiconductor apparatus 26 as a first example of Embodiment 2; FIG. 5B shows a semiconductor apparatus 28 as a second example of Embodiment 2; and FIG. 5C shows a semiconductor apparatus 30 as a third example of Embodiment 2.

The first through third examples have in common that a protection film 38 is formed under a protection film 32 on whose slant surface an inner wall 36 of a through hole 34 is formed. Also, the protection film 38, like the protection film 32, has a through hole at a position corresponding to the electrode pad 20, and the protection film 38 covers the circumferential edge of the electrode pad 20. In this way, the protection of the circumferential edge of the electrode pad 20 and the substrate 12 is enhanced when the protection film 38 is further provided.

The semiconductor apparatus 26 (see FIG. 5A) and the semiconductor apparatus 28 (see FIG. 5B) are examples in which the protection film 38 as a whole including the opening edge is buried in the protection film 32 since the through hole of the protection film 38 is smaller than the through hole 34 of the protection film 32 in diameter. On the other hand, the semiconductor apparatus 30 (see FIG. 5C) is an example in which the opening edge of the protection film 38 is exposed, not covered by the protection film 32 since the through hole of the protection film 38 is larger than the through hole 34 of the protection film 32 in diameter.

In any of the cases, the inner wall 36 of the through hole 34 of the protection film 32 is formed on the slant surface as in Embodiment 1. Thus, the structure produces an effect that it prevents, as much as possible, the bump 18 from running over the edge of the metal layer 24 or 40.

Note that the metal layer 24 is formed by the sputtering or the vapor deposition as in Embodiment 1. The fixing unit 40 is formed by plating.

<Embodiment>3

Figure 6A:
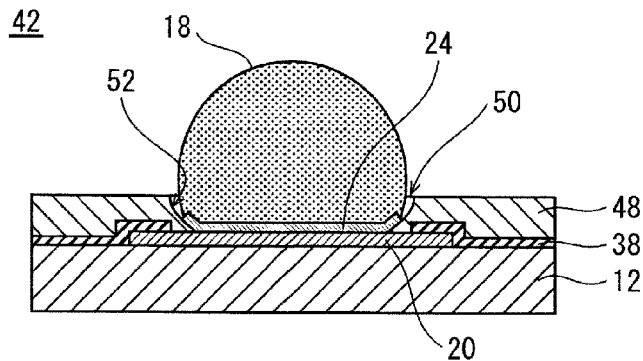
FIGS. 6A-6D are partial cross-sectional views of semiconductor apparatuses as the first through fourth examples of Embodiment 3 taken along a line passing through a bump.
Figure 6B:
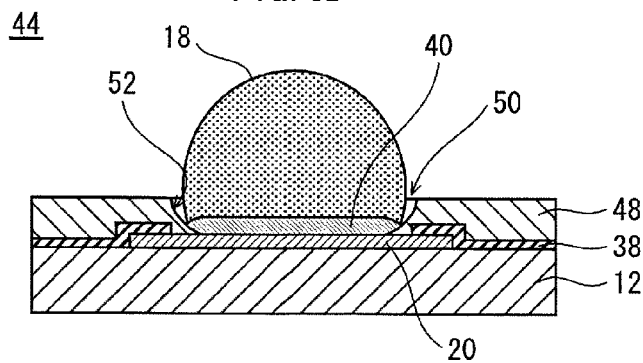
Figure 6C:
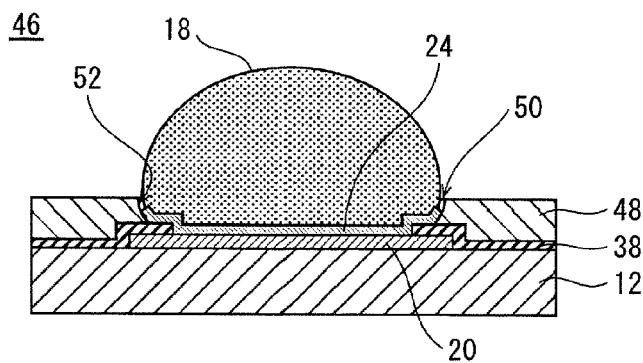
Figure 6D:
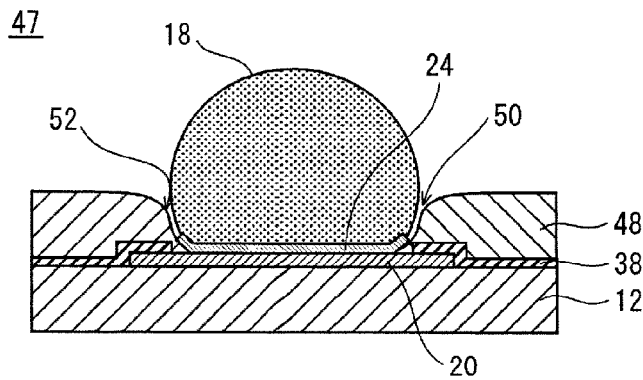

FIGS. 6A-6D are partial cross-sectional views of the semiconductor apparatus of Embodiment 3 taken along a line passing through a bump. FIG. 6A shows a semiconductor apparatus 42 as a first example of Embodiment 3; FIG. 6B shows a semiconductor apparatus 44 as a second example of Embodiment 3; FIG. 6C shows a semiconductor apparatus 46 as a third example of Embodiment 3; and FIG. 6D shows a semiconductor apparatus 47 as a fourth example of Embodiment 3.

The semiconductor apparatuses 42, 44 and 46 as the first through third examples of Embodiment 3 are basically the same as the semiconductor apparatuses 26, 28 and 30 as the first through third examples of Embodiment 2, except for the structure of the protection film. Also, the semiconductor apparatus 47 as the fourth example of Embodiment 3 is basically the same as the semiconductor apparatus 26 as the first example of Embodiment 2, except for the structure of the protection film. Thus in FIGS. 6A-6D, the same structural components as those in FIGS. 5A-5C are assigned the same reference signs and description thereof is omitted, and the description centers on the differences.

In the semiconductor apparatuses 26, 28 and 30 (see FIGS. 5A-5C), the inner wall 36 of the through hole 34 of the protection film 32 is formed in the shape of an approximately tapered plane (the slant angle is approximately constant). On the other hand, in Embodiment 3, the inner wall 36 of the through hole 40 is formed in the shape of a curved plane so that the slant angle thereof changes depending on the distance from the substrate 12.

More specifically, in the semiconductor apparatuses 42, 44 and 46 as the first through third examples of Embodiment 3, an inner wall 52 of a through hole 50 formed in a protection film 48 is formed in the shape of a curved plane in which the further the distance from the substrate 12 (the electrode pad 20) is, the larger the slant angle is (the steeper the slant surface is).

With this structure, even if the bump material 1018 (see FIG. 4) runs over the edge of the metal layer 24 (40), the extension of the bump material 1018 (see FIG. 4) is stopped more effectively by the inner wall 52 having a slant angle that is larger than the circumferential edge of the metal layer 24 (40).

Note that the protection film 48 is made of polyimide, and the protection film 48 can be formed into the above shape of a curved-plane by first forming the side wall of the through hole into the shape of an approximately tapered plane, and then performing the ashing onto the side wall of the through hole.

Also, in the semiconductor apparatus 47 as the fourth example of Embodiment 3, as shown in FIG. 6D, the inner wall 52 of the through hole 50 formed in the protection film 48 is formed in the shape of a curved plane in which the further the distance from the substrate 12 (the electrode pad 20) is, the larger the slant angle is (the steeper the slant surface is), and in the vicinity of the surface of the protection film 48 further away from the edge of the metal layer 24, the slant angle is smaller (the slant surface is less steep). That is to say, it is structured such that, in an area extending from the electrode pad 20 up to the middle of the slant surface 22, the further the distance from the electrode pad 20 is, the larger the slant angle of the slant surface 22 to the electrode pad 20 is; and in an area extending from the middle of the slant surface 22 to the surface of the protection film 38, the further the distance from the electrode pad 20 is, the smaller the slant angle is.

Figure 4:
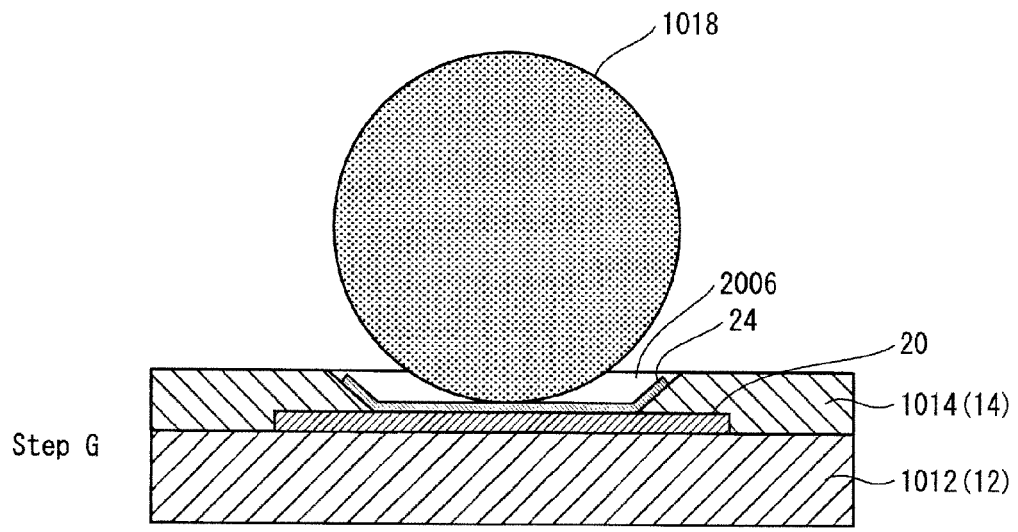
FIG. 4 illustrates some steps constituting the manufacturing process of the semiconductor apparatus in Embodiment 1.
Figure 4:
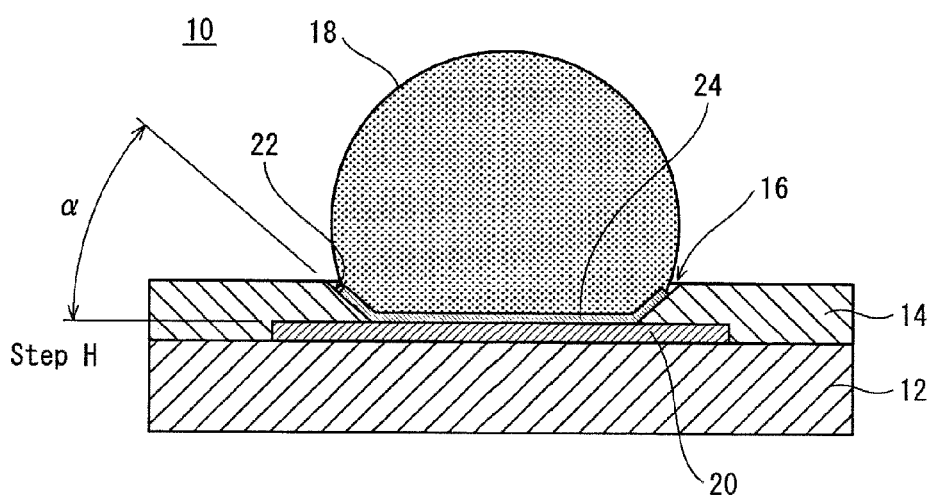

This structure produces effects that a part of the inner wall 52 having a larger slant angle than the circumferential edge of the metal layer 24 stops the extension of the bump material 1018 more effectively, and since the slant angle of the inner wall 52 is smaller in the vicinity of the surface of the protection film 48, the opening is widened and the mounting of the bump material 1018 becomes easier (see FIG. 4).

Note that, in the fourth example, the semiconductor apparatus may be structured by replacing the metal layer 24 with the metal layer 40 of the second example.

<Embodiment>4

Figure 7A:
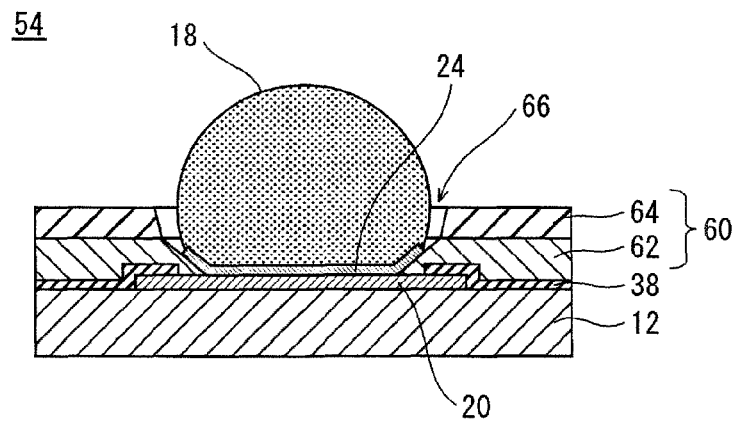
FIGS. 7A-7C are partial cross-sectional views of semiconductor apparatuses as the first through third examples of Embodiment 4 taken along a line passing through a bump.
Figure 7B:
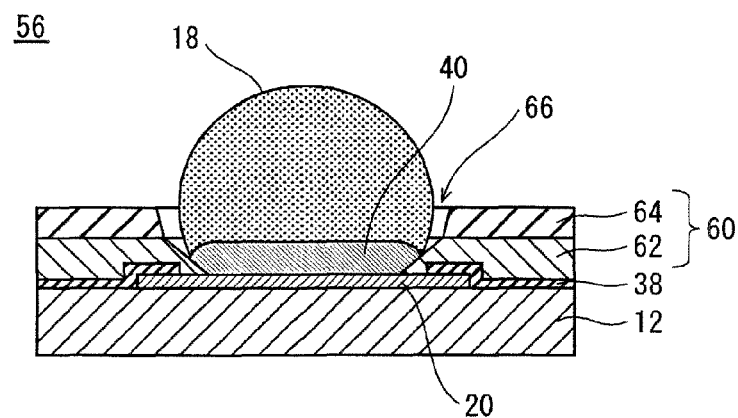
Figure 7C:
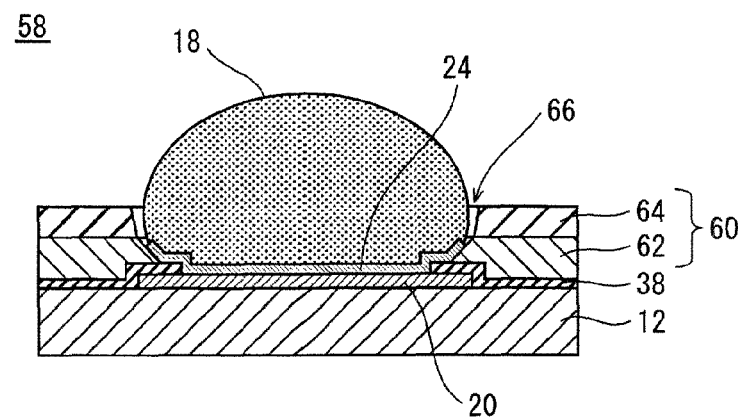

FIGS. 7A-7C are partial cross-sectional views of the semiconductor apparatus of Embodiment 4 taken along a line passing through a bump. FIG. 7A shows a semiconductor apparatus 54 as a first example of Embodiment 4; FIG. 7B shows a semiconductor apparatus 56 as a second example of Embodiment 4; and FIG. 7C shows a semiconductor apparatus 58 as a third example of Embodiment 4.

Embodiment 4 differs from Embodiments 1-3 in that the protection film has a two-layer structure, while in Embodiments 1-3, the protection film has a one-layer structure and the inner wall of the through hole is formed to be a slant surface.

The semiconductor apparatuses 54, 56 and 58 as the first through third examples of Embodiment 4 are basically the same as the semiconductor apparatuses 26, 28 and 30 as the first through third examples of Embodiment 2, except for the structure of the protection film. Thus in FIGS. 7A-7C, the same structural components as those in FIGS. 5A-5C are assigned the same reference signs and description thereof is omitted, and the description centers on the differences.

The protection film 60 of the semiconductor apparatuses 54, 56 and 58 has a two-layer structure composed of a first layer 62 and a second layer 64 arranged in this order from the substrate 12.

In the inner wall of the through hole 66 of the protection film 60, a portion of the inner wall in the first layer 62 and a portion of the inner wall in the second layer 64 have different slant angles. More specifically, the portion in the second layer 64 has a larger slant angle (steeper) than the portion in the first layer 62.

This structure of the present embodiment produces the same effect as Embodiment 3.

Here, a manufacturing method of the semiconductor apparatus having the protection film 60 with the two-layer structure will be described by taking a semiconductor apparatus 58 (see FIG. 7C) as an example.

The electrode pad 20, which is made of aluminum or the like, is formed on a surface of the substrate 12 on which a bump is to be formed, and then a protection film 38 made of silicone nitride ($Si_3N_4$) is formed to cover the surface of the substrate 12 on which a bump is to be formed and the electrode pad 20. Following this, the protection film 38 is selectively removed so that a part (central part) of the electrode pad 20 is exposed.

Next, the first layer 62 is formed by using a spinner to apply, for example, polyimide onto the electrode pad 20 and the protection film 38 evenly. The second layer 64 is then formed by applying polyimide having a lower etching tolerance, namely a higher etching speed, onto the first layer 62. Note that it is known that the two kinds of polyimide having different etching speeds can be prepared by, for example, heating two polyimide layers at different temperatures when they are thermally hardened (Japanese Patent Application Publication No. H1-312084).

The upper surface of the second layer 64 is covered with a photoresist pattern having a predetermined shape, and they are soaked in the etching liquid. This allows portions of the layers not covered by the photoresist pattern to start being etched, and due to the difference in the etching speed, the first layer 62 and the second layer 64 which are, as shown in FIG. 7C, different in slant angle of the processed wall in the cross section are obtained. Note that the method of processing the polyimide may be used in combination with other method such as the laser ablation.

Next, the metal layer 24 that is approximately in the range from $1 \times 10^{-3}$ mm to $7 \times 10^{-3}$ mm in thickness is formed, for example, in the following way. The oxide film is removed from the surface of the electrode pad 20 by performing the soft etching thereonto, then they are soaked in the zincate solution to allow the zinc particles to be deposited, and then they are soaked in the non-electrolyte nickel (Ni) plating liquid to allow a Ni film, which is approximately $5 \times 10^{-3}$ mm in thickness, to be formed on the electrode pad 20. Furthermore, they may further be soaked in the non-electrolyte gold (Au) plating liquid to allow a flash Au plating, which is approximately $5 \times 10^{-5}$ mm in thickness, to be formed on the Ni film.

Next, the bump 18 is formed on the metal layer 24. The bump 18 is formed by the ball mount method, plating method, dispense method or the like. When, for example, the ball mount method is used, a printing mask is prepared, the printing mask being a metal plate that is approximately in the range from 0.02 mm to 0.04 mm in thickness and has an opening at a position corresponding to the metal layer 24. After the whole surface of the substrate 12 except for an area in which the bump is to be formed is covered with the printing mask, a rubber or metal squeegee is used to print the flux onto the surface of the metal layer 24 (onto the area in which the bump is to be formed).

Next, a mounting mask, which has an opening at a position corresponding to the metal layer 24, is used to mount the bump material onto the metal layer 24 on which the flux has been printed.

After this, the substrate 12, on which the bump material has been mounted, is subjected to heat treatment in which the bump material is melted and connected with the metal layer 24. In the above process, the flux printed on the metal layer 24 mainly has two functions: to hold the bump material; and to remove the oxide film during the remelting (reflow). As the flux used in the above processing, a rosin-based or water-soluble flux may be used. In particular, it is preferable that a rosin-based flux of a halogen-free type is used.

As the bump material, a solder ball made of a solder material such as tin, silver, or copper is preferable, but a material having other composition may be used. With regard to the size of the bump material, it is preferable that the diameter thereof is approximately in a range from 0.07 mm to 0.125 mm. Note that, when the bump material is not spherical, different from the present example, it is preferable that an average value of the longitudinal length and the lateral length is approximately in a range from 0.07 mm to 0.125 mm.

<Embodiment>5

Figure 8A:
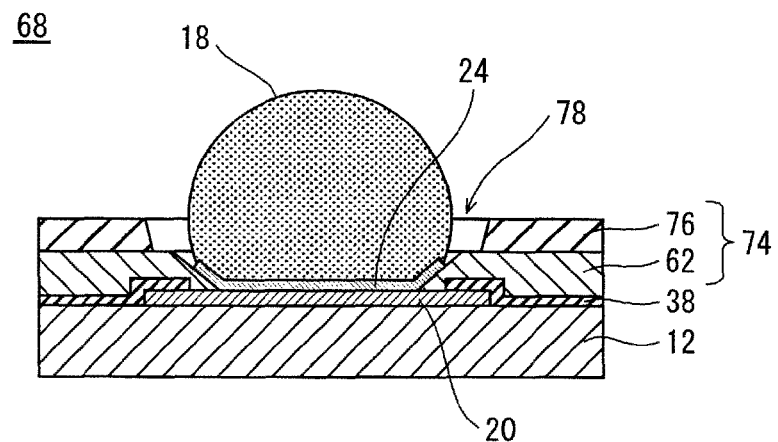
FIGS. 8A-8C are partial cross-sectional views of semiconductor apparatuses as the first through third examples of Embodiment 5 taken along a line passing through a bump.
Figure 8B:
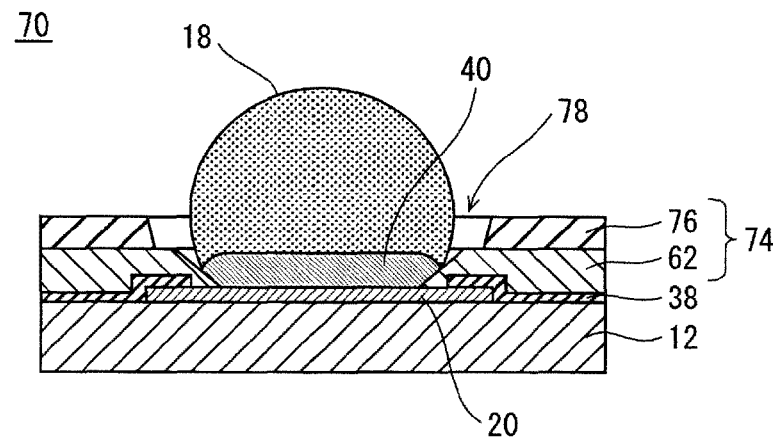
Figure 8C:
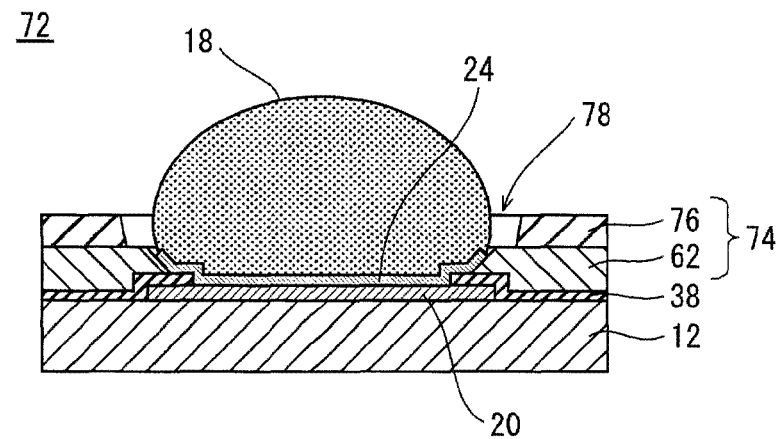

FIGS. 8A-8C are partial cross-sectional views of the semiconductor apparatus of Embodiment 5 taken along a line passing through a bump. FIG. 8A shows a semiconductor apparatus 68 as a first example of Embodiment 5; FIG. 8B shows a semiconductor apparatus 70 as a second example of Embodiment 5; and FIG. 8C shows a semiconductor apparatus 72 as a third example of Embodiment 5.

The semiconductor apparatuses 68, 70 and 72 as the first through third examples of Embodiment 5 are basically the same as the semiconductor apparatuses 54, 56 and 58 as the first through third examples of Embodiment 2 (see FIGS. 7A-7C), except for the structure of the second layer constituting the protection film. Thus in FIGS. 8A-8C, the same structural components as those in FIGS. 7A-7C are assigned the same reference signs and description thereof is omitted, and the description centers on the differences.

In the semiconductor apparatuses 68, 70 and 72 as the first through third examples of Embodiment 5, the through hole formed in a second layer 76 constituting a protection film 74 is set to be larger in diameter than the corresponding through hole in Embodiment 4. In other words, the circumferential edge of the through hole formed in the second layer 76 is set back toward outside in the radial direction, so that the inner wall of the through hole 78 formed in the protection film 74 is formed in a staircase pattern, with a difference in height between the first layer 62 and the second layer 76.

This structure makes it possible to provide the effect of reducing/preventing the stick-out of the bump, and to set the normal bump shape and the permissible limit of the stick-out more freely. These are in particular effective when the bump is expected to be varied in volume.

Note that the protection film 74, in which the through hole 78 whose inner wall is staircase-like is formed, may be formed by performing the etching step of the first layer 62 separately from the etching step of the second layer 76.

<Embodiment>6

Figure 9A:
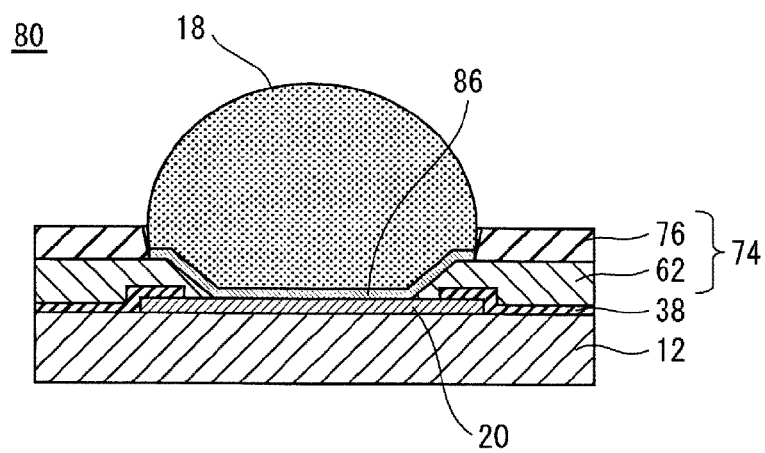
FIGS. 9A-9C are partial cross-sectional views of semiconductor apparatuses as the first through third examples of Embodiment 6 taken along a line passing through a bump.
Figure 9B:
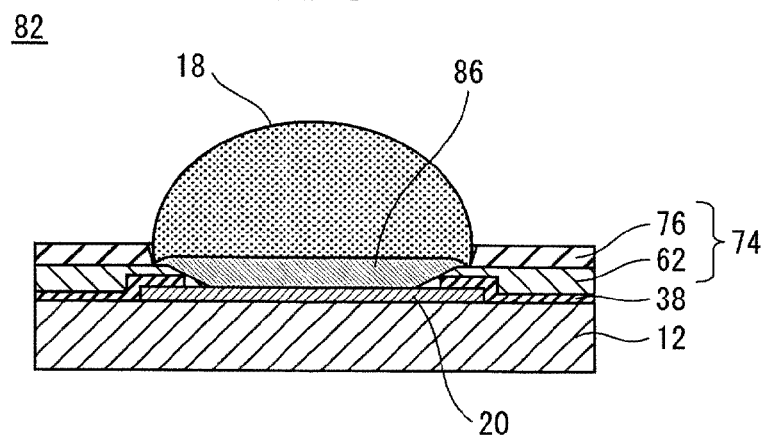
Figure 9C:
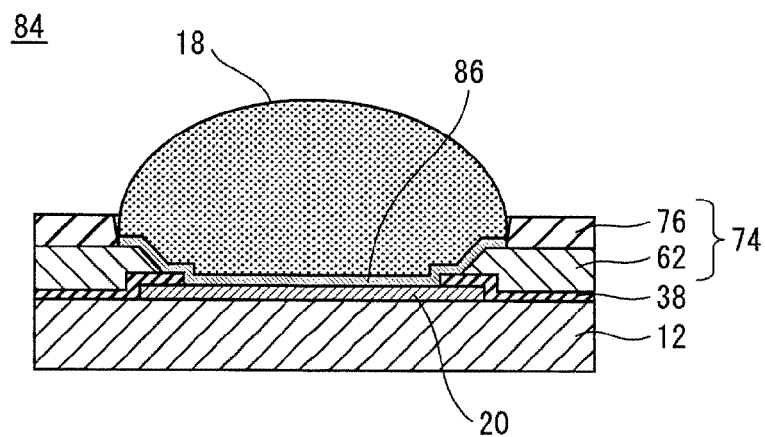

FIGS. 9A-9C are partial cross-sectional views of the semiconductor apparatus of Embodiment 6 taken along a line passing through a bump. FIG. 9A shows a semiconductor apparatus 80 as a first example of Embodiment 6; FIG. 9B shows a semiconductor apparatus 82 as a second example of Embodiment 6; and FIG. 9C shows a semiconductor apparatus 84 as a third example of Embodiment 6.

The semiconductor apparatuses 80, 82 and 84 as the first through third examples of Embodiment 6 are basically the same as the semiconductor apparatuses 68, 70 and 72 as the first through third examples of Embodiment 5 (see FIGS. 8A-8C), except for the metal layer formation area. Thus in FIGS. 9A-9C, the same structural components as those in FIGS. 8A-8C are assigned the same reference signs and description thereof is omitted, and the description centers on the differences.

In Embodiment 5, the circumferential edge of the metal layer 24 is, in height, at approximately the middle of the inner wall of the through hole formed in the first layer 62 of the protection film 74 (see FIGS. 8A-8C). On the other hand, in Embodiment 6, the circumferential edge of a metal layer 86 is extended up to the step between the first layer 62 and the second layer 76, namely, up to the upper surface of the first layer 62, and the circumferential edge of the metal layer 86 is in contact with the inner wall of the through hole formed in the second layer 76.

With this structure, it is possible to enhance the effect of reducing/preventing the stick-out of the bump 18 from the metal layer 86, and to minimize the variation from the normal bump shape.

<Embodiment>7

Figure 10A:
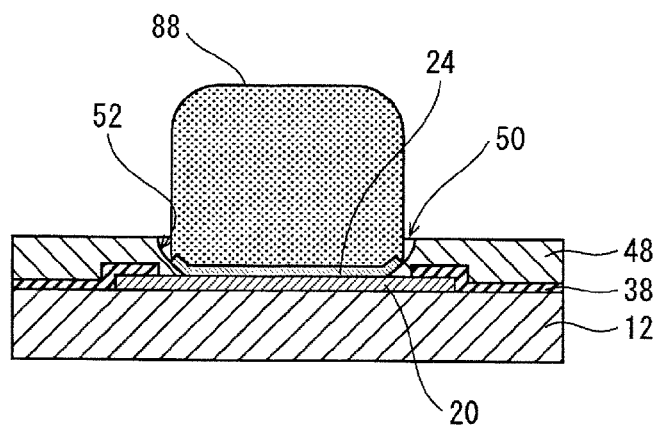
FIGS. 10A-10C are partial cross-sectional views showing other examples of the bump material used for bumps in the semiconductor apparatuses as the first through third examples of Embodiment 3.
Figure 10B:
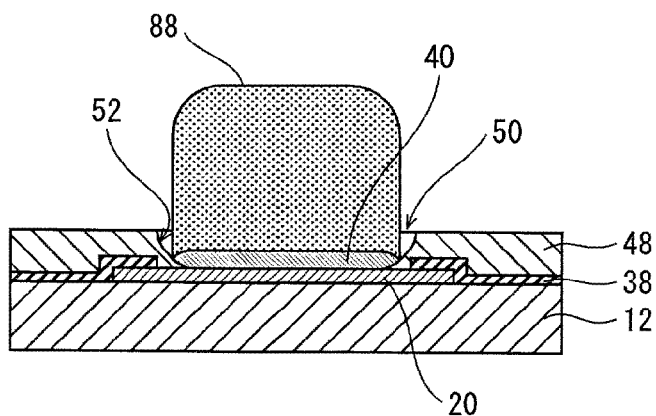
Figure 10C:
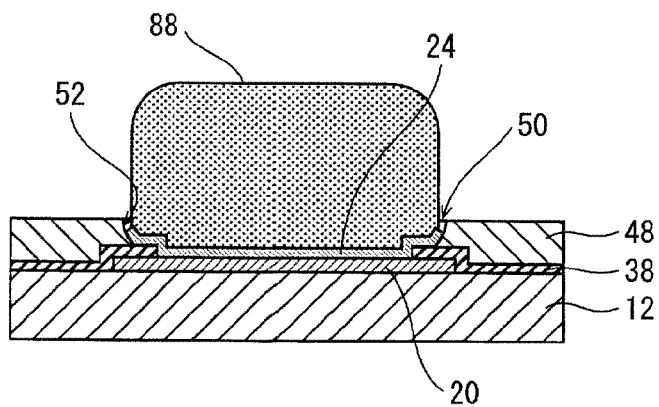

FIGS. 10A-10C show modifications to the shape of the bump 18 used in Embodiment 3 (see FIGS. 6A-6D). The sign "88" in FIGS. 10A-10C indicates a bump having a shape after a reflow. Note that the semiconductor apparatuses of these modifications are basically the same in structure as the semiconductor apparatuses 42, 44 and 46 as the first through third examples of Embodiment 3, except for the bump shape. Thus in FIGS. 10A-10C, the same structural components as those in FIGS. 6A-6D are assigned the same reference signs and description thereof is omitted.

In Embodiment 7, the bump 88 has the shape of a cylinder (pellet). That is to say, after the bump material is mounted, it is melted by the reflow so as to be cylindrical like the bump 88.

As shown in FIGS. 10A-10C as one example, with the adoption of the bump shape 88 that satisfies the relationship that the (maximum) outer diameter of the bump material is smaller than the outer diameter of the metal layer 24 (40), the effect of reducing/preventing the stick-out of the bump is improved. That is to say, the more the (maximum) outer diameter of the bump material 88 in the transverse section is, the higher the risk that the bump sticks out of the metal layer 24 (40) is. In this way, when a bump shape that satisfies the relationship "maximum outer diameter of bump material 88≦outer diameter of metal layer" is adopted, the effect of reducing/preventing the stick-out of the bump is further improved.

<Embodiment>8

Figure 11:
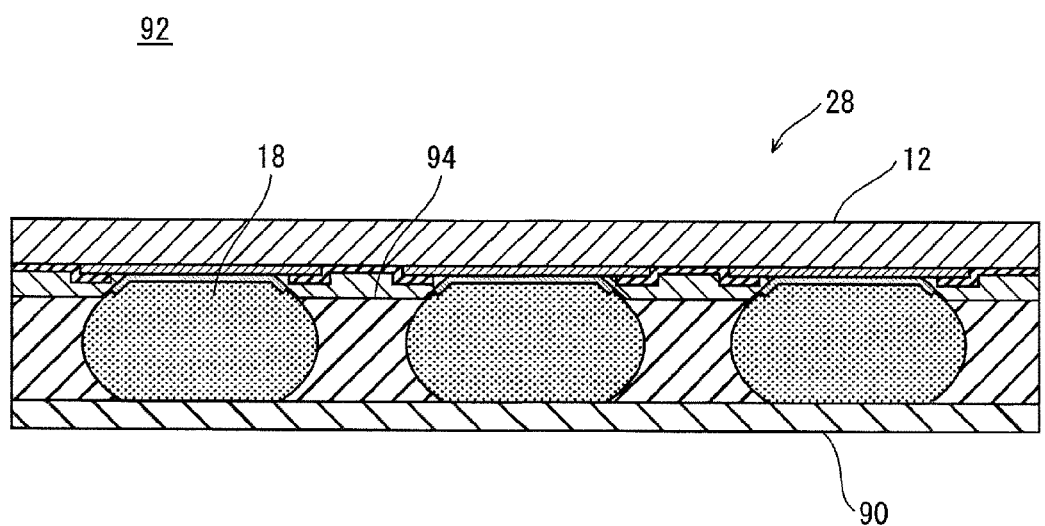
FIG. 11 is a partial cross-sectional view of a semiconductor apparatus unit in Embodiment 8.

FIG. 11 is a partial cross-sectional view of a semiconductor apparatus unit 92 in which a semiconductor apparatus 28 (see FIG. 5B) is mounted on a mounting substrate 90. FIG. 11 is a cross-sectional view taken along a line passing through the bump 18.

As shown in FIG. 11, the semiconductor apparatus 28 has been mounted on the mounting substrate 90 which is an organic resin substrate. The space between the substrate 12 of the semiconductor apparatus 28 and the mounting substrate 90 is filled with an underfill resin 94. The resin layer absorbs the difference in expansion, which is caused by the difference in the rate of thermal expansion, between the semiconductor apparatus 28 (substrate 12) and the mounting substrate 90. Such a structure is in demand especially in the field of FC-BGA or FC-PoP which is centered on an area connection that is advantageous for multiple pins and is superior in high-speed transmissibility.

INDUSTRIAL APPLICABILITY

The semiconductor apparatus of the present invention is suitably usable in, for example, small semiconductor packages that are provided with a plurality of bumps on one surface of a substrate such as CSP or BGA.

REFERENCE SIGNS LIST 10,26,28,42,44,46,47,54,56,58,68,70,72,80,82,84 semiconductor apparatus
12 substrate
14,32,38,48,60,72 protection film
16,34,50,66 through hole
18 bump
20 electrode pad
22,36,52 inner wall (slant surface)
24,40,86 metal layer
62 first layer
64,76 second layer

The invention claimed is:

1. A semiconductor apparatus comprising:
  a substrate;
  a plurality of electrode pads formed on a surface of the substrate; and
  a protection film having a plurality of through holes formed in one-to-one correspondence with the electrode pads, and covering circumferential edge portions of the electrode pads and the surface of the substrate except for areas under the electrode pads, wherein:
  an inner wall of each through hole is a slant surface slanted such that the through hole expands with distance from an electrode pad corresponding thereto,
  a plurality of metal layers have been formed in one-to-one correspondence with the electrode pads,
  each of the metal layers covering (i) an exposed part of a corresponding electrode pad not covered by the protection film and (ii) an area of a corresponding slant surface extending from the exposed part up to a middle of the slant surface,
  a plurality of bumps have been connected one-to-one with the plurality of metal layers,
  the protection film has a two-layer structure composed of a first layer and a second layer stacked on the substrate in this order, and
  a circumferential end of each of the metal layers is positioned at a middle of the first layer in a thickness direction.

2. The semiconductor apparatus of claim 1, wherein a slant angle of a slant surface in the second layer to the electrode pad is larger than a slant angle of a slant surface in the first layer to the electrode pad.

3. The semiconductor apparatus of claim 2, wherein a diameter of a through hole in the second layer is larger than a diameter of a through hole in the first layer, and the slant surface in each through hole has been formed in a staircase pattern.

4. The semiconductor apparatus of claim 1, wherein the protection film has a third layer between the substrate and the first layer.

5. The semiconductor apparatus of claim 4, wherein a slant angle of a slant surface in the third layer to the electrode pad is larger than a slant angle of a slant surface in the first layer to the electrode pad.

6. The semiconductor apparatus of claim 1, wherein a thickness of the second layer is thinner than a thickness of the first layer.

7. The semiconductor apparatus of claim 1, wherein an upper surface of each of the metal layers is located under an upper surface of the first layer.

8. The semiconductor apparatus of claim 4, wherein:
  each of the metal layers is connected to the first layer, and
  each of the metal layers is not connected to the third layer.

9. The semiconductor apparatus of claim 4, wherein a thickness of the third layer is thinner than a thickness of the first layer.

10. The semiconductor apparatus of claim 4, wherein a thickness of the third layer is thinner than a thickness of the second layer.

11. A semiconductor apparatus comprising:
  a substrate;
  an electrode pad disposed on a surface of the substrate;
  a first protection film disposed on the surface of the substrate, the first protection film having a first opening, and the electrode being exposed from the first opening;
  a second protection film disposed on the first protection film, the second protection film having a second opening, and the electrode being exposed from the second opening; and
  a metal layer disposed on the electrode pad, wherein:
  a side surface of the first protection film closest to the first opening is covered by the second protection film, and
  an end of the metal layer is positioned at a middle of the second protection film in a thickness direction.

12. The semiconductor apparatus of claim 11, wherein a diameter of the second opening at a top surface of the second protection film is larger than a diameter of the first opening.

13. The semiconductor apparatus of claim 11, wherein a third protection film is disposed on the second protection film, the third protection film having a third opening, and the electrode being exposed from the third opening.

14. The semiconductor apparatus of claim 11, wherein a slant angle of the side surface of the first protection film to the electrode pad is larger than a slant angle of a side surface of the second protection film to the electrode pad.

15. The semiconductor apparatus of claim 13, wherein a slant angle of a side surface of the third protection film to the electrode pad is larger than a slant angle of a side surface of the second protection film to the electrode pad.

16. The semiconductor apparatus of claim 13, wherein a thickness of the third protection film is thinner than a thickness of the second protection film.

17. The semiconductor apparatus of claim 11, wherein an upper surface of the metal layer is located under an upper surface of the second protection film.

18. The semiconductor apparatus of claim 11, wherein:
  the metal layer is connected to the second protection film, and
  the metal layer is not connected to the first protection film.

19. The semiconductor apparatus of claim 11, wherein a thickness of the first protection film is thinner than a thickness of the second protection film.

20. The semiconductor apparatus of claim 13, wherein a thickness of the first protection film is thinner than a thickness of the third protection film.

* * * * *